United States Patent [19]
Rieger

[11] Patent Number: 5,675,543
[45] Date of Patent: Oct. 7, 1997

[54] INTEGRATED SEMICONDUCTOR MEMORY DEVICE

[75] Inventor: Johann Rieger, Zell, Germany

[73] Assignee: Siemens Aktiengesellschaft, Munich, Germany

[21] Appl. No.: 694,533

[22] Filed: Aug. 9, 1996

[30] Foreign Application Priority Data

Aug. 9, 1995 [EP] European Pat. Off. ............... 95112549

[51] Int. Cl.$^6$ ............................... G11C 7/00; G11C 29/00
[52] U.S. Cl. ........................................ 365/200; 365/325.7
[58] Field of Search ..................................... 365/200, 201, 365/225.7, 189.01

[56] References Cited

U.S. PATENT DOCUMENTS

| | | | |
|---|---|---|---|
| 5,313,423 | 5/1994 | Sato et al. | 365/200 |
| 5,377,146 | 12/1994 | Reddy et al. | 365/200 |
| 5,416,740 | 5/1995 | Fujita et al. | |

FOREIGN PATENT DOCUMENTS

| | | |
|---|---|---|
| 0 504 434 A1 | 9/1992 | European Pat. Off. |
| 42 41 327 A1 | 6/1993 | Germany . |
| 2 231 984 | 11/1990 | United Kingdom . |

Primary Examiner—David C. Nelms
Assistant Examiner—Vu A. Le
Attorney, Agent, or Firm—Herbert L. Lerner; Laurence A. Greenberg

[57] ABSTRACT

Integrated semiconductor memory device having a semiconductor substrate with a redundant circuit arrangement formed thereon for replacing a defective memory cell of the integrated semiconductor memory device by selecting a redundant memory cell likewise disposed on the semiconductor substrate, the memory cells of the integrated semiconductor memory device being constructed and addressable in blocks; the redundant memory cells being combined into a redundant memory cell field addressable as a unit by the redundant circuit arrangement; and the redundant circuit arrangement having a redundant selection circuit for selecting a redundant memory cell from the redundant memory cell field to replace a defective memory cell from any of the memory cell blocks, includes a redundance control circuit forming part of the redundant circuit arrangement and enabling, as a function of a programmed redundant selection signal, one of the data content of a normal memory cell and the data content of a redundant memory cell suitably substituted in the event of a defect in the normal memory cell of the redundant memory cell field, the redundance control circuit being connected downstream from read amplifier circuits for reading out data from the normal memory cells and from read amplifier circuits for reading out redundant data from the redundant memory cells.

11 Claims, 6 Drawing Sheets

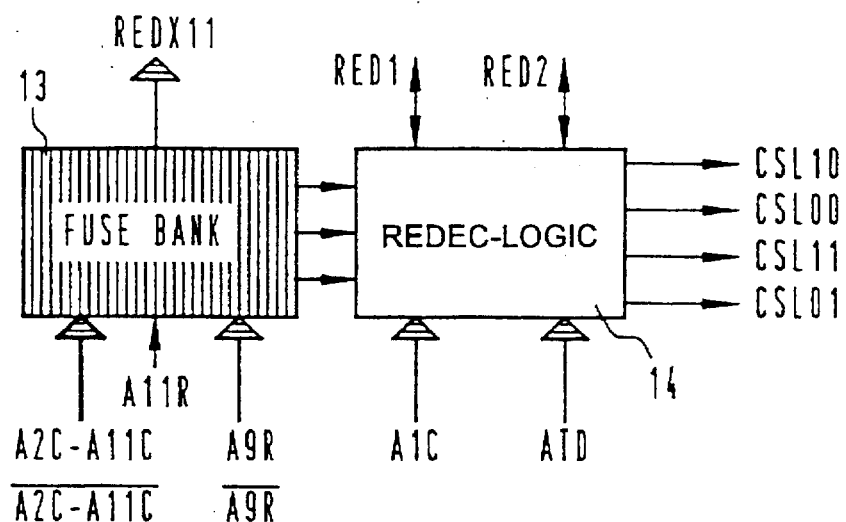
FIG 3
FIG 4
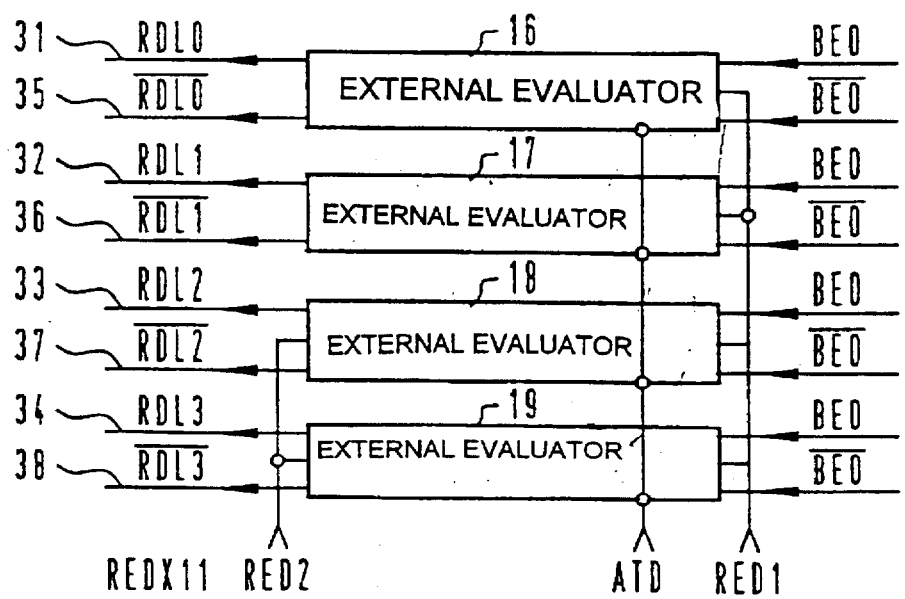
FIG 5

INTEGRATED SEMICONDUCTOR MEMORY DEVICE

BACKGROUND OF THE INVENTION

Field of the Invention

The invention relates to an integrated semiconductor memory device having a redundant circuit arrangement formed on a semiconductor substrate of the semiconductor memory device for replacing a defective memory cell of the integrated semiconductor memory device by selecting a redundant memory cell from a plurality thereof likewise disposed on the semiconductor substrate, the memory cells of the integrated semiconductor memory device being embodied and addressable in blocks.

In modern integrated semiconductor memories, the memory cells are disposed in a plurality of memory field block units. In operation, to save electric current and time, as a rule only one memory field block unit at a time is activated as a function of or in accordance with address signals. To increase the yield in the manufacture of these semiconductor memories, it has become known heretofore to provide redundant lines with redundant memory cells along the redundant lines. Memories with a plurality of memory field block units accordingly have in the memory field block units, beyond the normal bit lines with normal memory cells, a further one to, for example, eight or sixteen redundant lines with redundant memory cells. In operation, if needed, or in other words if redundant memory cells are intended to replace normal memory cells ("redundant case"), the redundant lines are triggered instead of the normal lines. This is effected via so-called redundant decoders, which are programmable to the address of the respective normal line having the defective memory cells which are to be replaced. The programing is performed in a conventional manner via so-called fuse elements which can be interrupted by means of electric current or by means of a laser beam.

SUMMARY OF THE INVENTION

It is accordingly an object of the invention to provide an integrated semiconductor memory device with a redundant circuit arrangement which, as needed or, in other words, when defective memory cells are present, enables better utilization of the redundant circuit arrangement and which, moreover, requires minimal area, as well as, reduced memory access time both in the redundant case and in the nonredundant case.

With the foregoing and other objects in view, there is provided, in accordance with the invention, an integrated semiconductor memory device having a semiconductor substrate with a redundant circuit arrangement formed thereon for replacing a defective memory cell of the integrated semiconductor memory device by selecting a redundant memory cell likewise disposed on the semiconductor substrate, the memory cells of the integrated semiconductor memory device being constructed and addressable in blocks; the redundant memory cells being combined into a redundant memory cell field addressable as a unit by the redundant circuit arrangement; and the redundant circuit arrangement having a redundant selection circuit for selecting a redundant memory cell from the redundant memory cell field to replace a defective memory cell from any of the memory cell blocks, comprising a redundance control circuit forming part of the redundant circuit arrangement and enabling, as a function of a programmed redundant selection signal, one of the data content of a normal memory cell and the data content of a redundant memory cell suitably substituted in the event of a defect in the normal memory cell of the redundant memory cell field, the redundance control circuit being connected downstream from read amplifier circuits for reading out data from the normal memory cells and from read amplifier circuits for reading out redundant data from the redundant memory cells.

In accordance with another feature of the invention, the redundant selection circuit is disposed and formed, respectively, at a given location of the integrated semiconductor memory device and spatially separated from each individual one of the memory cell blocks and each of the normal memory cells, respectively. In accordance with a further feature of the invention, the redundant circuit arrangement is disposed at a peripheral region of the integrated semiconductor memory device.

In accordance with an added feature of the invention, the semiconductor memory device includes data input/output circuits, and the redundant circuit arrangement is disposed in an immediate vicinity of the data input/output circuits of the semiconductor memory device.

In accordance with an additional feature of the invention, the redundant memory cells of the redundant memory cell field are addressable as a unit by the redundant circuit arrangement and are disposed in matrix form at intersections of redundant columns and redundant rows, and the redundant circuit arrangement has a word line decoder for selecting the respective redundant rows, and the redundant selection circuit has a plurality of redundant column decoders for selecting the respective redundant columns.

In accordance with yet another feature of the invention, one of the column decoders, simultaneously with accessing a column of a memory cell block, by selection of a bit line for the normal memory cells, accesses the redundant memory cell field addressable as a unit by the redundant circuit arrangement. In accordance with yet a further feature of the invention, a programming device for fixed programming of an address of the redundant memory cell field is assigned to the redundance control circuit.

In accordance with yet an added feature of the invention, the programming device for fixed programming of a column address of the redundant memory cell field has fuse elements which are interruptible by light or electric current.

In accordance with yet an additional feature of the invention, the redundance control circuit has a logic circuit with at least one multiplex circuit activatable as a function of a redundant selection signal which is output by the programming device.

In accordance with another feature of the invention, the semiconductor memory device includes a semiconductor dynamic random access memory.

In accordance with a concomitant feature of the invention, the semiconductor dynamic random access memory has 16 MB, 64 MB, 256 MB or more memory cells, and the redundant memory cell field has 256 word lines and 64 to 1 k redundant bit lines.

Thus, the integrated semiconductor memory device according to the invention is distinguished in that the redundant memory cells are combined into a redundant memory cell field which is addressable as a unit by the redundant circuit arrangement; and the redundant circuit arrangement has a redundant selection circuit for the selection of a redundant memory cell from the unitary redundant memory cell field for the replacement of a defective memory cell from an arbitrary memory cell block. Preferably, the redundant selection circuit may be disposed or embodied at a given location of the integrated semiconductor memory device and spatially separated from each individual memory cell block or each normal memory cell.

The invention is based first on the idea of decoupling the circuits intended for the redundance provisions spatially from the memory cell blocks and combining them as a unit at a predetermined location of the integrated semiconductor memory device. Instead of the blockwise-arranged redundance provisions, the invention thus contemplates disposing the redundant circuits centrally as to function. In the case of a centrally arranged column redundance, additional word decoder circuits are indeed necessary; in dynamic memories, however, despite this additional expense for circuitry, the area/use ratio, particularly in larger semiconductor memories of about 16 MB of DRAM and up, is more favorable overall than in the distributed redundance provisions heretofore known from the prior art. As a result of the redundance arrangement according to the invention, better utilization of the redundant memory cells is assured, because memory cells from any memory cell blocks and memory cell units can be replaced with redundant memory cells, so that while the number of redundant memory cells remains constant, considerably more redundant memory cells can be used than with the heretofore known redundance arrangements.

In a further feature of the invention, the redundant circuit arrangement has a redundance control circuit which, as a function of a programmed redundant selection signal, enables either the data content of the normal memory cell or the data content of the redundant memory cell suitably substituted in the event of a defect in the normal memory cell of the redundant memory cell field.

The redundant evaluator circuit has a programming device assigned thereto for fixed programming of a column address of the redundant memory cell field. The programming device for fixed programming of a column address of the redundant memory cell field has fuse elements which can be interrupted, i.e., for breaking a respective circuit.

A further advantage of the arrangement of the invention relates to the access time of the semiconductor memory. Whereas, in contrast with the state of the prior art wherein, as a rule, the redundant data of a redundant cell intended to replace the defective memory cell results only after the enabling of the normal column decoder by the redundant decoder, which makes for an access time lag, the central arrangement of the redundant circuit according to the invention permits the decision to be made as to whether normal or redundant data are to be output only after the actual data is output. A considerable reduction in the access time, on approximately the order of magnitude of 2 ns (2 nanoseconds) thereby occurs. To that end, provision is made for the redundance control circuit to be connected downstream of both the read amplifier circuits for the data to be read out of the normal memory cells and the read amplifier circuits for the redundant data to be read out of the redundant memory cells. The redundance control circuit may have a comparison circuit with at least one multiplex circuit activatable as a function of the redundant selection signal which is output by the programming device.

In a preferred embodiment of the invention, for space-saving reasons, provision is made for the redundant circuit arrangement to be disposed on or at a peripheral region of the integrated semiconductor memory device. Advantageously, the redundant circuit arrangement may be disposed in the immediate vicinity of the data input/output circuits of the semiconductor memory device, in order to achieve brief transit times for the multiplex signal.

In an especially preferred embodiment, the invention is based on column redundance. The redundant memory cells of the redundant memory cell field, addressable as a unit by the redundant circuit arrangement, are disposed in matrix form at the intersections of redundant columns and redundant rows, and the redundant circuit arrangement addresses the word line decoder for selecting the redundant rows. Furthermore, the redundant selection circuit has a generally freely selectable number of redundant column decoders for selecting the redundant columns. For example, in central column redundance according to the invention, 32 or 64 column redundance decoders may be provided for universal use, each organized into four columns. Such an arrangement would correspond to a total of 128 and 256 columns, respectively. In a 16 MB DRAM, this would be from 0.5 to 1 column redundance decoder per 256 k memory block, or 2 to 4 redundant columns per 256 k memory block. In a distributed redundance provision as in the prior art, this would permit only very few opportunities for repair. In a 4 MB DRAM, approximately 1.8 column repairs per chip are expected which, when extrapolated to a 16 MB DRAM, would mean about 7.2 column repairs. A number of 32 and 64 column redundance decoders, respectively, in the central column redundance of the invention would thus correspond to about 4.5 and 9 times, respectively, the usual column repair frequency, and would therefore be adequate.

Other features which are considered as characteristic for the invention are set forth in the appended claims. Although the invention is illustrated and described herein as embodied in an integrated semiconductor memory device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, wherein:

BRIEF DESCRIPTION OF THE DRAWING

FIG. 3 is a diagrammatic and schematic view of a column redundance decoder in the semiconductor memory device of the invention;

FIG. 4 is a table of the signals output by the column redundance decoder as a function of the programmed states of the fuse elements;

FIG. 5 is a more detailed, fragmentary diagrammatic and schematic view of FIG. 2 serving to explain data administration in the semiconductor memory device of the invention;

DESCRIPTION OF THE PREFERRED EMBODIMENTS

Figure 1:
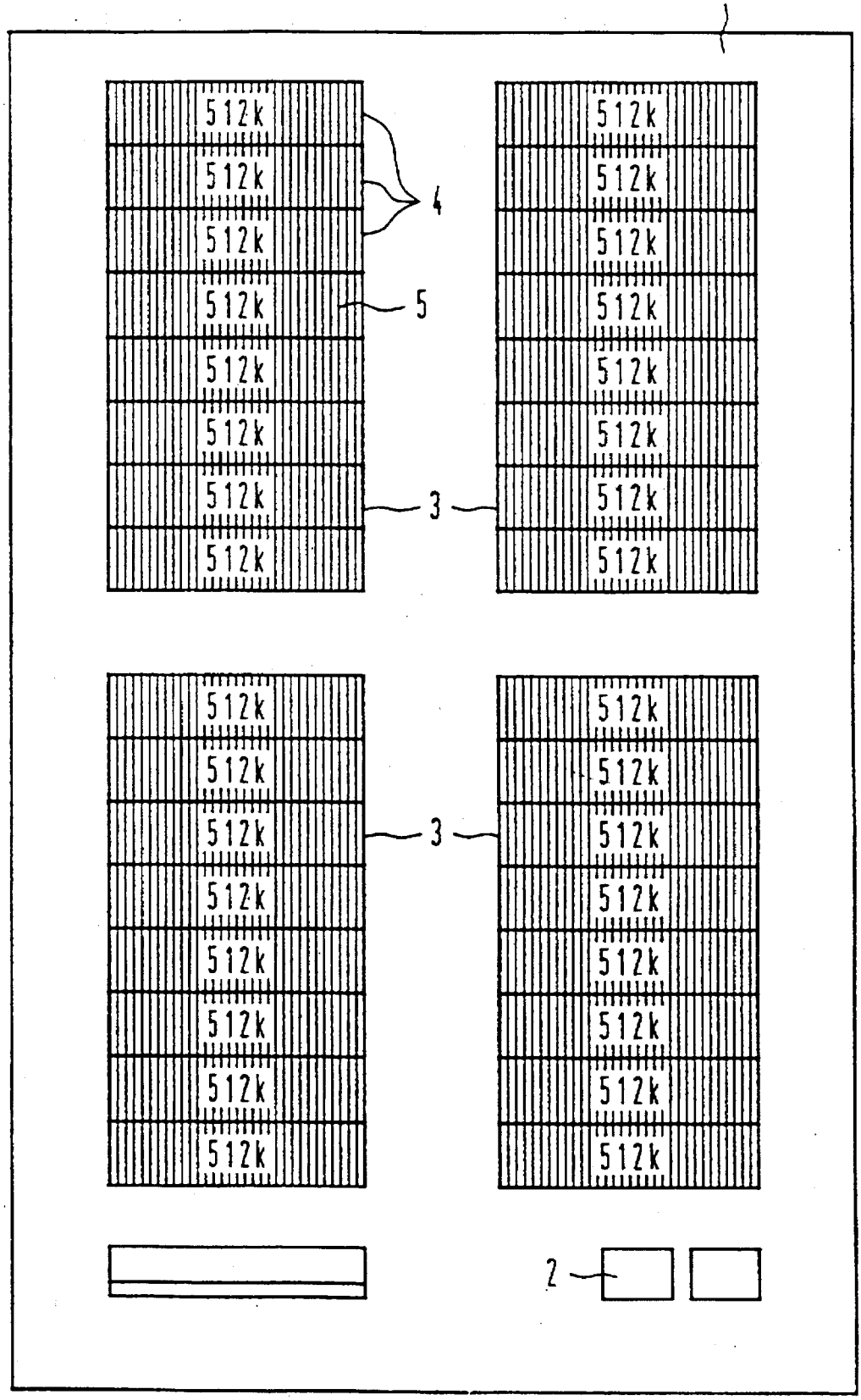
FIG. 1 is a diagrammatic plan view of a 16 MB DRAM with memory cells arranged in blocks of 512 K each, and a redundant circuit arrangement disposed in a peripheral region of the memory device.

Referring now to the drawings and, first, particularly to FIG. 1 thereof, there is shown therein diagrammatically a preferred embodiment of the semiconductor memory device according to the invention having a redundant circuit arrangement 2 formed on a semiconductor substrate 1 for replacing a defective memory cell by a redundant memory cell also disposed on the semiconductor substrate 1. Where activated signals or signals in the activated state are referred to, these signals are meant to have the state "log 1"; otherwise, they have the state "log 0". This involves what is known as positive logic and is used solely in the interest of simplifying the explanation. Other logic conventions are naturally possible as well. The semiconductor memory device shown is a 16 MB dynamic semiconductor memory with random access ("DRAM"), and it has four memory field block units 3 with memory cells contained therein. Each memory field block unit 3 is thus understood to be a unit having eight arrays and memory cell blocks 4, respectively, of memory cells which are activatable and drivable independently of one another in a conventional manner. The memory cells 5, arranged in the blocks 4, respectively, so as to number 512 K will, for terminology purposes, be referred to hereinafter as normal memory cells, the addressing and operation of which can be performed in a conventional manner without the aid of any redundant circuitry of any kind. The normal memory cells 5 are arranged along and are thus addressable via normal word lines not shown in further detail and along normal bit lines, also not shown in further detail, each normal bit line typically including two halves. Generally known read amplifiers are connected to the normal bit lines. The memory cells 5 are thereby addressable via the respectively associated normal bit lines and normal word lines by means of address signals applicable to the semiconductor memory 1, typically by the well known address multiplexing method. In this regard, at a first instant of time, the word line address signals responsible for the word line addressing, controlled by a clock signal/RAS, are buffer-stored in a word line address buffer. At a second instant of time, the bit line address signals responsible for the bit line addressing, controlled by a clock signal/CAS, are buffer-stored in a bit line address buffer. These address signals appear in true and complementary form at the outputs of the address buffers.

During operation, in such a semiconductor memory, not all of the memory field block units are activated and operated simultaneously, but rather, only one memory field block unit, respectively, at a time,. To that end, each memory field block unit is selectable by means of a block selection signal associated with the respective memory field block unit. The selection is effected by means of an otherwise non-illustrated block decoder, which is controlled by a first portion of the word line address signals and of the signals complementary thereto.

Figure 2:
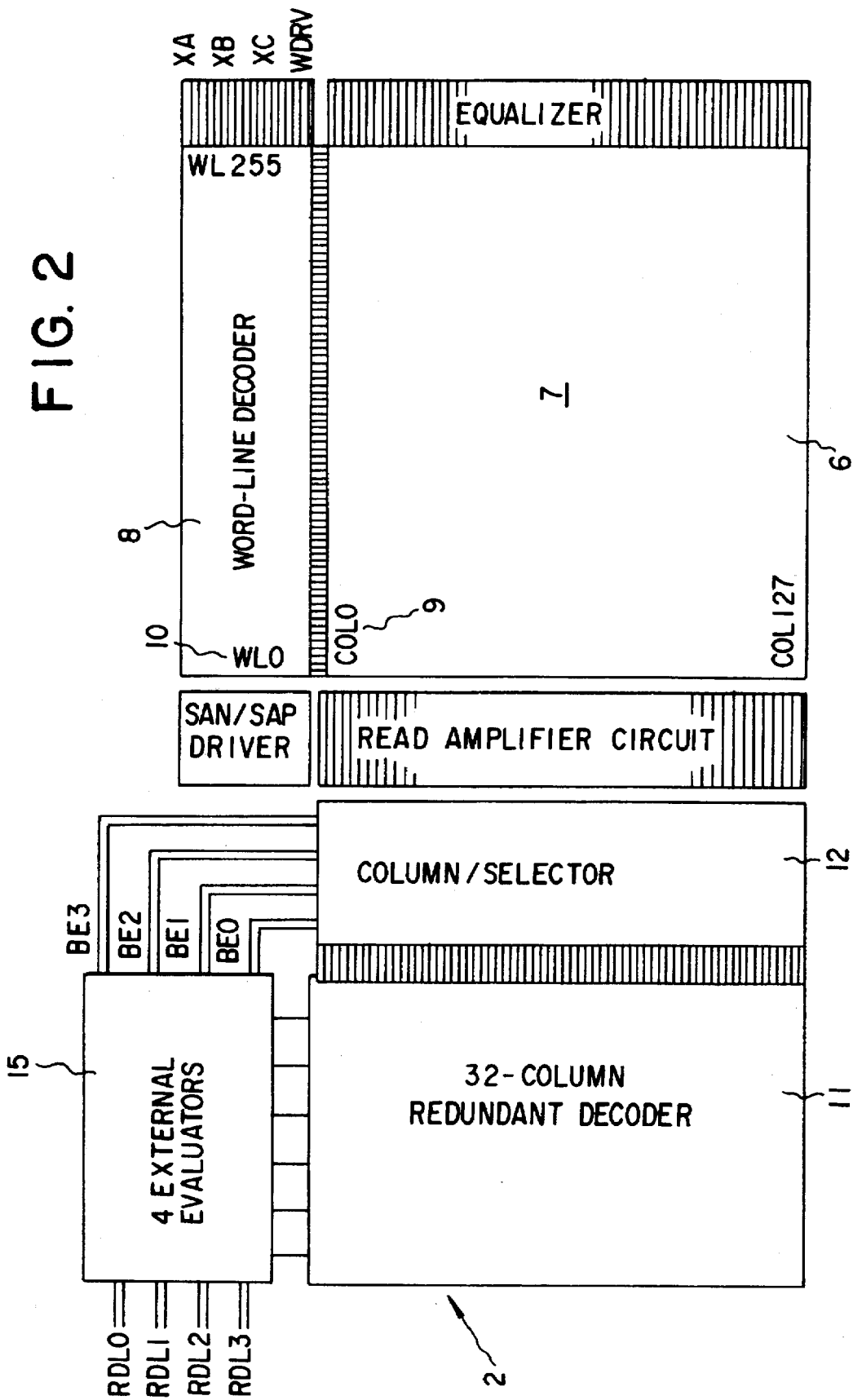
FIG. 2 is a diagrammatic and schematic view, in greater detail, of the redundant circuit arrangement combined outside the memory cell blocks in the semiconductor memory device of FIG. 1.
Figure 6:
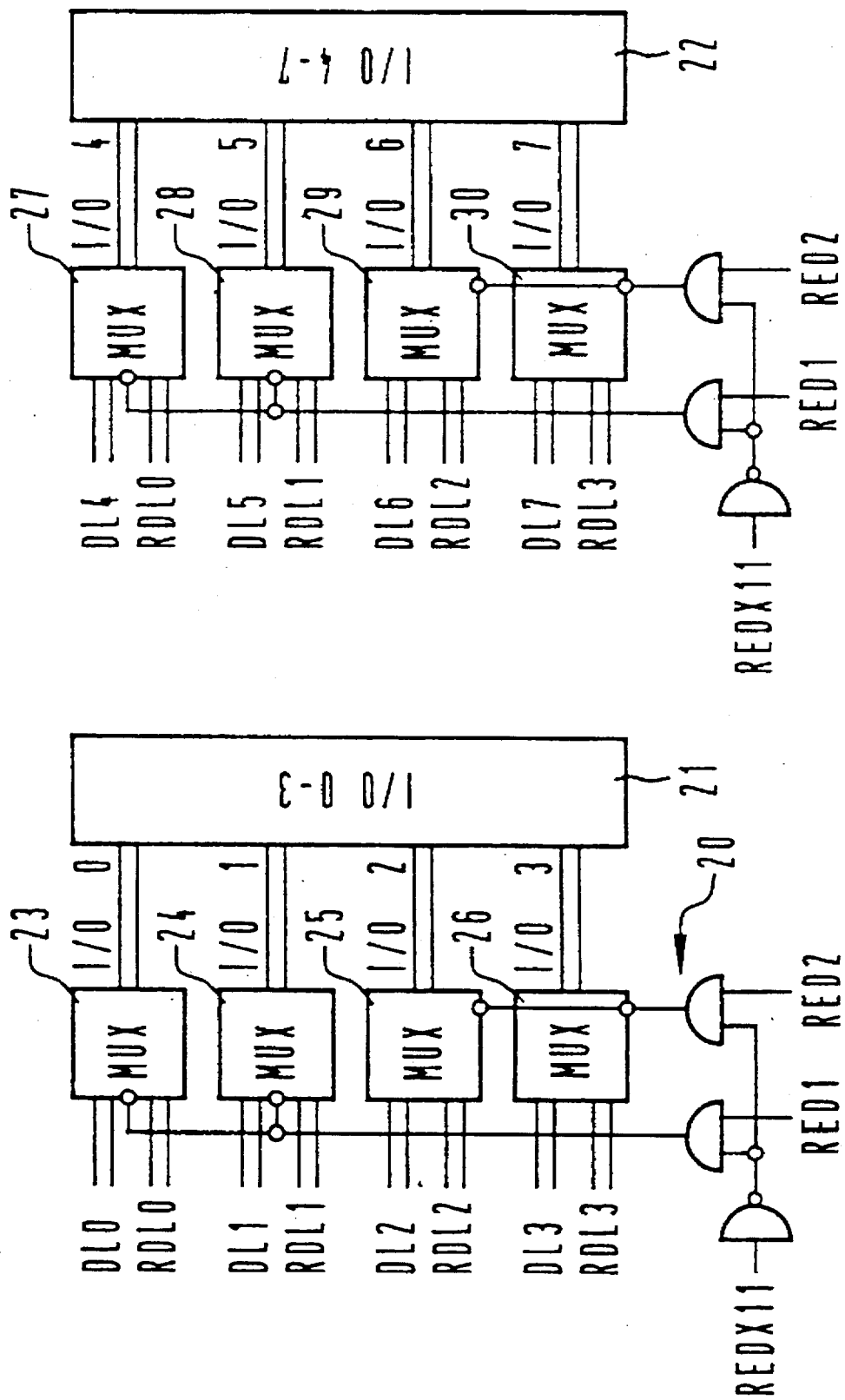
FIG. 6 is a diagrammatic and schematic view of a redundant evaluator circuit in the redundant circuit arrangement of the invention.

As shown in FIG. 2, in accordance with the invention, the redundant memory cells 6 outside the memory cell blocks 4 are combined into a redundant memory cell field 7 addressable as a unit by the redundant circuit arrangement 2; specifically, the redundant memory cells 6 as shown in FIG. 2 are arranged in a matrix and are addressable via a word line decoder 8 and via 32 redundant column decoders 11. The redundant memory cells 6 are utilizable for replacing defective normal memory cells; the defect can occur either in the memory cells themselves which are to be replaced or in connection with the operation thereof, such as errors in the associated bit lines, read amplifiers, or address decoders, for example.

In the case illustrated, the redundant memory cells 6 of the redundant memory cell field 7 are organized in a matrix of 128 redundant columns 9 and 256 word lines 10, and are selected by means of the word line decoder 8 and the 32 redundant column decoders 11, which are assigned to a redundant column selection circuit 12 provided in the redundant circuit arrangement 2. Each of the 32 redundant column decoders 11 is constructed identically in terms of circuitry and includes the components described hereinafter in further detail in conjunction with FIG. 3. For addressing the redundant memory cells 6, a programmable fuse bank 13 having a number of laser-separable fuse units corresponding to the number of triggerable redundant memory cells 6 is provided, the fuse units being associated with the applied address signals A2C through A11C, on the one hand, and /A2C through /A11C, on the other hand, respectively, and generate a redundant selection signal REDX 11 for distinguishing whether data bits in the data line DL0 to DL3 or in the data line DL4 to DL7 are to be replaced. The signal REDX 11 is thus output as a function of whether or not a fuse unit associated with the address A11R is activated. The programmable fuse bank 13 is followed by a redundant decoder logic circuit 14 which, as a function of the redundant selection signals programmed by the fuse bank 13, generates column selection signals CSL10, CSL00, CSL11, CSL01 required for triggering the respective redundant column decoders 11. Moreover, as a function of a block selection address A1C, an address enable signal ATD (=address transient data), either the left-hand block half of a 512 K block is selected with the signal RED1, or the right-hand block half is selected with the signal RED2, the signals RED1 and RED2 being applicable simultaneously and being determined by the fuse unit A9R of the selected redundant decoder. Thus, up to two redundant decoders can be selected simultaneously. The table in FIG. 4 shows one example of the column selection signals CSL10, CSL00, CSL11, CSL01, as a function of the logical states of the fuse unit A9R and of the address signal A1C.

FIG. 5 shows further details of an evaluator circuit 15, associated with the 32 redundant column decoders 11 and the redundant column selection circuit 12, with four external read amplifiers 16, 17, 18, 19, to which the bit line signals BE0 to BE3, which are output by the redundant column selection circuit 12, and the correspondingly complementary bit line signals /BE0 to /BE3, as well as the signals RED1 and RED2, which are output by the redundant column decoder 11, and the signal ATD are delivered, and redundant data RDL0 to RDL3 and complementary redundant data /RDL0 to /RDL3 are output over the redundant data lines 31, 32, 33, 34 and complementary redundant data lines 35, 36, 37, 38. The redundant data lines 35, 36, 37, 38 and the normal data lines DL0 to DL7 are multiplexed with a logic signal 20 which switches the multiplexers (MUX) 23 to 30. As a function of the signals RED1, RED2, the multiplexer switches through either the redundant data lines or the normal data lines to the data output (I/O).

Figure 7:
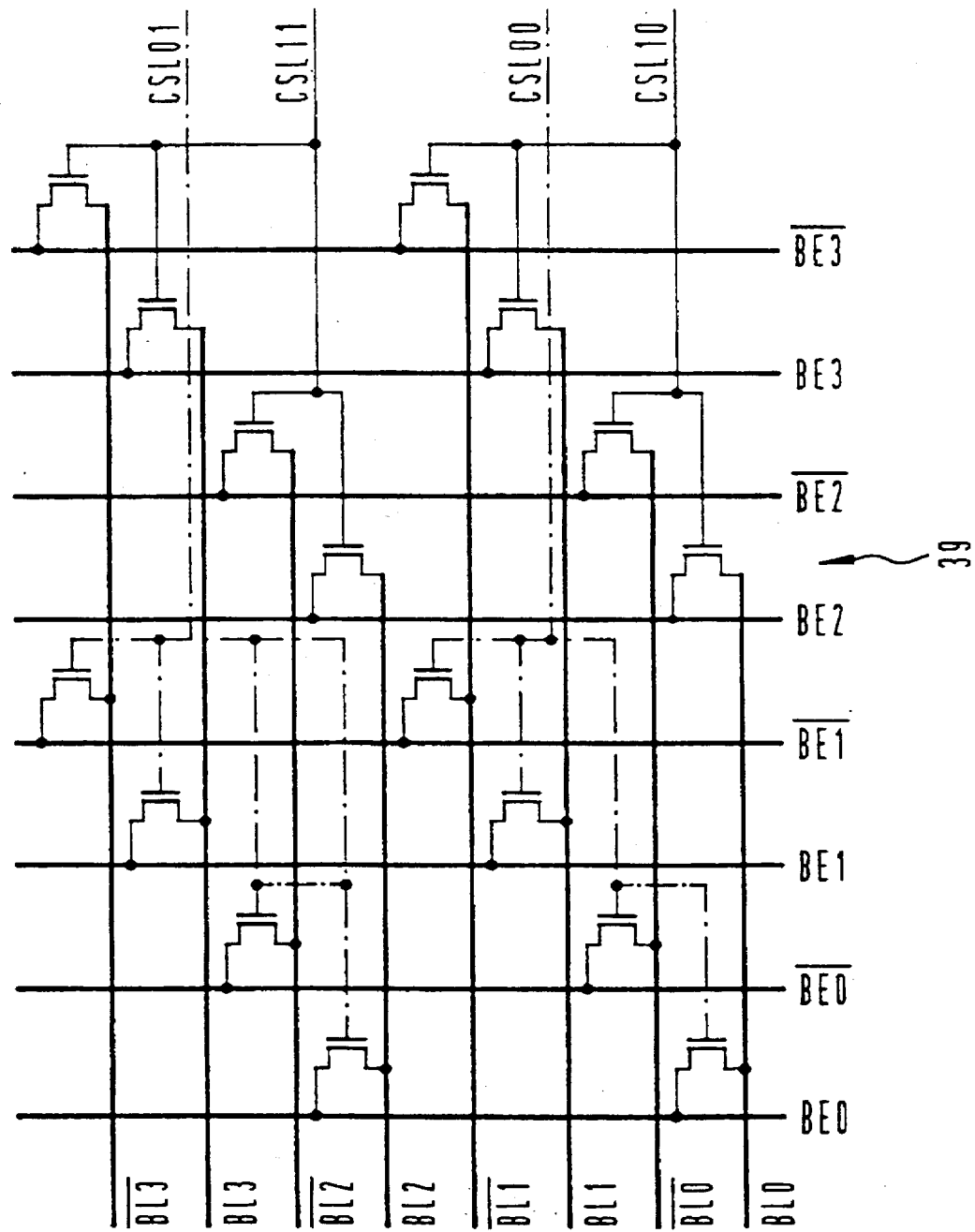
FIG. 7 is a schematic diagram of a selection of redundant columns.

In FIG. 7, an exemplary switching matrix 39 is also shown, which may be assigned to the redundant column selection circuit 12, so that, as a function of the column selection signals CSL10, CSL00, CSL11, CSL01, a conversion can be effected of the bit line signals of the redundant memory cell field 7, which are present on the bit lines BL0 to BL3 and complementary bit lines /BL0 to /BL3, into signals BE0 to BE3 and complementary signals /BE0 to /BE3, which are supplied to the read amplifier circuit 15.

Figure 8:
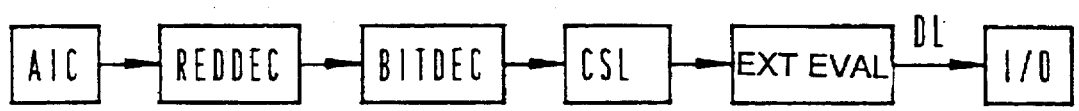
FIG. 8 is a schematic diagram showing the time sequence of the redundance provisions in the prior art.
Figure 9:
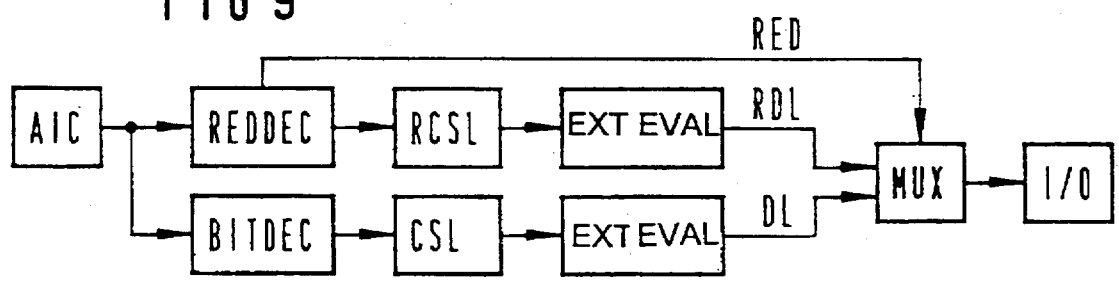
FIG. 9 is a schematic diagram showing the time sequence of the redundance provisions of the device according to the invention.

From the schematic illustrations of FIGS. 8 and FIG. 9, the advantage of the invention will once again be explained with respect to a shorter access time. The abbreviations used in FIGS. 8 and 9 refer to the following components: AIC= address input column (input column address), REDDEC= redundant decoder, BITDEC=bitline decoder, CSL=column selection, EXT BEW=external evaluator (external read amplifier), DL=data line, I/O=in/out circuit) (input/output circuit), RCSL=redundant column selection, MUX= multiplexer. Whereas, in the preceding embodiment according to FIG. 8, the normal column decoder in each case must be enabled by the redundant decoder, in the embodiment of the invention according to FIG. 9, the decision as to whether normal or redundant data are output is not made until the time of the actual data output, making possible a speed advantage of about 2 ns.

I claim:

1. Integrated semiconductor memory device having a semiconductor substrate with a redundant circuit arrangement formed thereon for replacing a defective memory cell of the integrated semiconductor memory device by selecting a redundant memory cell likewise disposed on the semiconductor substrate, the memory cells of the integrated semiconductor memory device being constructed and addressable in blocks; the redundant memory cells being combined into a redundant memory cell field addressable as a unit by the redundant circuit arrangement; and the redundant circuit arrangement having a redundant selection circuit for selecting a redundant memory cell from the redundant memory cell field to replace a defective memory cell from any of the memory cell blocks, comprising a redundance control circuit forming part of the redundant circuit arrangement and enabling, as a function of a programmed redundant selection signal, one of the data content of a normal memory cell and the data content of a redundant memory cell suitably substituted in the event of a defect in the normal memory cell of the redundant memory cell field, said redundance control circuit being connected downstream from read amplifier circuits for reading out data from the normal memory cells and from read amplifier circuits for reading out redundant data from the redundant memory cells.

2. Semiconductor memory device according to claim 1, wherein the redundant selection circuit is disposed and formed, respectively, at a given location of the integrated semiconductor memory device and spatially separated from each individual one of the memory cell blocks and each of the normal memory cells, respectively.

3. Semiconductor memory device according to claim 1, wherein the redundant circuit arrangement is disposed on a peripheral region of the integrated semiconductor memory device.

4. Semiconductor memory device according to claim 1, including data input/output circuits, and wherein the redundant circuit arrangement is disposed in an immediate vicinity of said data input/output circuits of the semiconductor memory device.

5. Semiconductor memory device according to claim 4, wherein the redundant memory cells of the redundant memory cell field are addressable as a unit by the redundant circuit arrangement and are disposed in matrix form at intersections of redundant columns and redundant rows, and the redundant circuit arrangement has a word line decoder for selecting the respective redundant rows, and the redundant selection circuit has a plurality of redundant column decoders for selecting the respective redundant columns.

6. Semiconductor memory device according to claim 5, wherein one of said column decoders, simultaneously with accessing a column of a memory cell block, by selection of a bit line for the normal memory cells, accesses the redundant memory cell field addressable as a unit by the redundant circuit arrangement.

7. Semiconductor memory device according to claim 6, wherein a programming device for fixed programming of an address of the redundant memory cell field is assigned to said redundance control circuit.

8. Semiconductor memory device according to claim 7, wherein said programming device for fixed programming of a column address of the redundant memory cell field has fuse elements which are interruptible by light or electric current.

9. Semiconductor memory device according to claim 7, wherein said redundance control circuit has a logic circuit with at least one multiplex circuit which is activatable as a function of a redundant selection signal which is output by said programming device.

10. Semiconductor memory device according to claim 1, includes a semiconductor dynamic random access memory.

11. Semiconductor memory device according to claim 10, wherein said semiconductor dynamic random access memory has 16 MB, 64 MB, 256 MB or more memory cells, and the redundant memory cell field has 256 word lines and 64 to 1 k redundant bit lines.

* * * * *